United States Patent [19]

DiLeo et al.

[11] 4,209,358
[45] Jun. 24, 1980

[54] METHOD OF FABRICATING A MICROELECTRONIC DEVICE UTILIZING UNFILLED EPOXY ADHESIVE

[75] Inventors: Daniel A. DiLeo, Hopewell Township, Mercer County, N.J.; Samuel E. Kurtz, Muhlenberg Township, Berks County; John J. Svitak, Lower Makefield Township, Bucks County, both of Pa.

[73] Assignee: Western Electric Company, Incorporated, New York, N.Y.

[21] Appl. No.: 966,411

[22] Filed: Dec. 4, 1978

[51] Int. Cl.² .................................................. H01L 21/603
[52] U.S. Cl. ........................................ 156/293; 29/589; 156/295; 156/330
[58] Field of Search ................. 156/293, 295, 330; 29/628, 590, 589, 569 L

[56] References Cited

U.S. PATENT DOCUMENTS

| | | | |
|---|---|---|---|
| 2,244,771 | 6/1941 | Figour | 175/366 |
| 2,774,747 | 12/1956 | Wolfson et al. | 260/32.8 |
| 3,100,080 | 8/1963 | Fiechter | 238/151 |
| 3,139,364 | 6/1964 | Fiechter | 156/160 |
| 3,202,596 | 8/1965 | Canauari | 204/148 |
| 3,536,546 | 10/1970 | Nielsen et al. | 156/630 |
| 3,795,047 | 3/1974 | Aboiafia et al. | 29/625 |
| 3,839,783 | 10/1974 | Dankert | 29/588 |
| 3,863,075 | 1/1975 | Ironmonger et al. | 250/552 |
| 3,905,094 | 9/1975 | Ruggeiro | 29/589 |
| 3,923,581 | 12/1975 | Payne et al. | 156/330 |

OTHER PUBLICATIONS

Moore, "Epoxy . . . Head" Western Electric Technical Digest, No. 50 (4/78), pp. 15-16.
"Epoxy-Bonding . . . Conductivity" Design News, Sep. 19, 1977.
Kulesza, "Where Epoxy . . . Today" Insulation/Circuits, (11/74), pp. 31-33.

*Primary Examiner*—Jerome W. Massie
*Attorney, Agent, or Firm*—D. J. Kirk

[57] ABSTRACT

A method of bonding microelectronic components (10, 23, 24) is disclosed. A light emitting diode (10) is bonded to a conductive lead (24) and/or a portion of a lead frame (23) using an adhesive having no metallic particles therein. The diode (10) is clamped to the conductive lead (24) and/or the lead frame (23) as the epoxy is cured. Such bonds have been found to exhibit low contact resistance in addition to long life and reliability.

4 Claims, 4 Drawing Figures

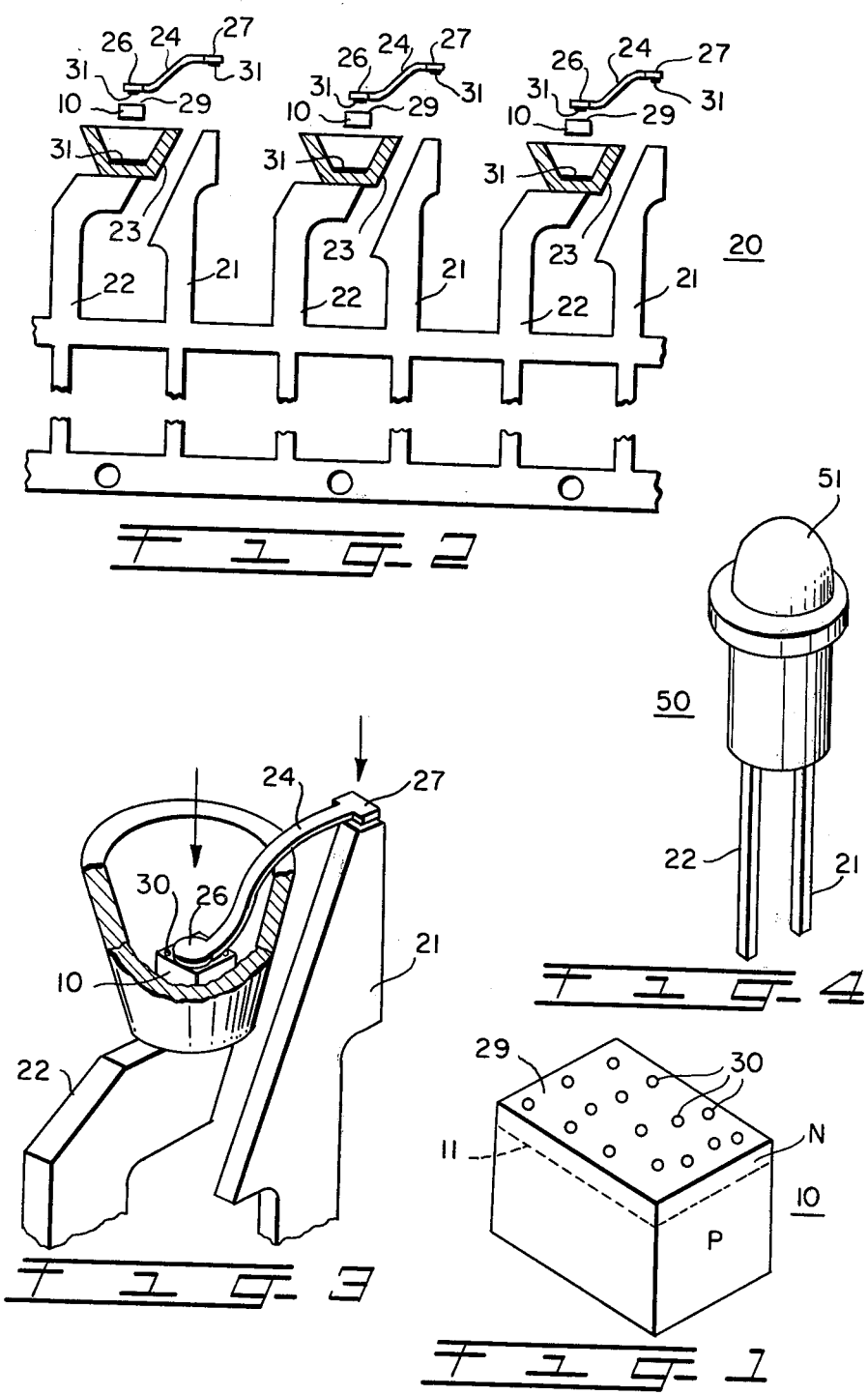

METHOD OF FABRICATING A MICROELECTRONIC DEVICE UTILIZING UNFILLED EPOXY ADHESIVE

TECHNICAL FIELD

This invention relates to a method of fabricating microelectronic devices. More particularly, the method is directed to electrically connecting components of the microelectronic devices using adhesive bonding techniques.

BACKGROUND OF THE INVENTION

A well-known solution in the prior art to the problem of bonding microelectronic components together is the use of an electrically conductive adhesive, such as an epoxy adhesive, typically comprising an epoxy material "filled" with metallic particles, e.g., silver, gold, copper, etc. dispersed therethrough, as described in an article titled "Where Epoxy Die Bonding for Microelectronics Stands Today" by F. W. Kulesza in *Insulation/Circuits*, November 1974, pages 31 to 33. That article describes the bonding of electrically conductive leads to terminals and electrical devices using the filled epoxy adhesive. Such a process has been found to be most effective and economically beneficial. However, when the devices to be bonded are certain semiconductor devices, such as light emitting diodes (LED's) having exposed junctions, it has been found that metallic ions associated with the particles in the adhesive migrate to the junction region and deleteriously affect the operation thereof.

SUMMARY OF THE INVENTION

The foregoing problem has been overcome by the instant method for providing an electrically conductive bond between first and second microelectronic components. The method is accomplished by coating at least a portion of the first and second components with a noble metal; applying an unfilled adhesive coating on the coated surface of at least one of the components and urging the components into intimate contact at the gold coated surfaces with the unfilled adhesive therebetween; and applying a clamping force to the components while curing the adhesive.

Surprisingly, the bond between the microelectronic components results in a low resistance connection having high mechanical strength and of a quality at least as acceptable as the bond formed using a filled adhesive.

Advantageously, the use of such unfilled adhesive obviates the aforementioned migration problem associated with the prior art technique.

Furthermore, the use of such unfilled adhesive precludes the need for precise adhesive deposition techniques, since the presence of the unfilled material in areas other than between the components being connected does not have the deleterious effects associated with the use of conductive fillers.

BRIEF DESCRIPTION OF THE DRAWING

FIG. 1 is an isometric view of an LED;

FIG. 2 is a partial cross-sectional view of a lead frame to which the LED is to be bonded;

FIG. 3 is an isometric view of an LED device electrically connected to a lead frame terminal; and FIG. 4 is an isometric view of an encapsulated LED.

DETAILED DESCRIPTION

The present invention is described primarily in terms of bonding a light emitting diode (LED) to an electrically conductive lead and/or a lead frame. However, it will be understood that such description is exemplary only and is for purposes of exposition and not for purposes of limitation. It will be readily appreciated that the inventive concept described is equally applicable to bonding any suitable microelectronic components together. It should be further appreciated that the inventive concept described is equally applicable to bonding a single assembly or simultaneously bonding a multitude of components.

FIG. 1 is an isometric view of an LED 10 which may be of any well-known construction and could include GaAs, GaP, GaPAs, GaAlAs compound semiconductor chips having adjacent P-type and N-type semiconductor region with a P-N junction 11 therebetween. The N-type and P-type regions are formed by well-known techniques such as diffusion, epitaxy or the like. The LED 10 exhibits electroluminescence in the vicinity of the P-N junction 11 when charge carriers of one type are injected into a region where the predominant charge carriers are of the opposite type. Radiation is emitted in conjunction with the recombination of pairs of oppositely charged carriers. In an exemplary embodiment, each LED 10 was a cube wherein each side was approximately 0.015 inch in length.

As hereinbefore indicated it is well known to form an electrical bond between microelectronic components using a filled epoxy (i.e., an epoxy having conductive metallic particles therein). However, when devices such as the LED 10 are bonded using such a filled epoxy, ions associated with the metallic particles therein migrate to the P-N junction 11 which seriously affects the operation of the device. The present invention overcomes this problem by using an unfilled adhesive (i.e., an epoxy having no metallic particles therein) to bond the microelectronic components together. From a mechanical standpoint, the bond so formed is one having high strength, thermal stability, structural integrity, and otherwise provides a connection that is at least equivalent in all respects to bonds formed using electrically conductive adhesives. Surprisingly, from an electrical standpoint, the bond also exhibits a low contact resistance. Although the mechanism is not fully understood, it appears that the clamping force used to bond the components causes the non-conductive adhesive to be moved into the interstices between high points on the surfaces of both components permitting the high points to touch or to be in close enough proximity to provide a low resistance, electrically conductive path between the components. A current of approximately 10 milliamps passes through the bonded LED 10.

It shold be emphasized that the surface of the components to be joined with the unfilled epoxy must be substantially free of insulating films, oxides or the like. Such contaminant-free surfaces are obtained and preserved for the lifetime of the assembly in the present invention by coating the surfaces with a thin layer of gold. Although gold has been found to be most effective, any other noble metal may be used. Additionally, other techniques, such as cleaning the components, bonding and use of the assembly in an environment where deleterious films, oxides or the like would be prevented or placing additives in the non-conducting adhesive to remove and prevent the formation of the undesirable films at the bond site may be used.

FIG. 2 depicts a lead frame, generally referred to by the numeral 20, having a plurality of first electrically conductive posts 21—21 and a second plurality of electrically conductive posts 22—22 terminating in conductive reflector cups 23—23. A plurality of interconnecting leads 24—24 having first and second ends 26 and 27, respectively, are shown in alignment with and spaced from the posts 21 and 22. In an exemplary embodiment, the leads 24—24 were 70 mils long, 5 mils wide and 1.4 mils thick with a 0.1 mil coating of gold thereon.

An LED 10 is shown interposed between the first ends 26—26 of the leads 24—24 and the reflector cups 23—23, the top surface 29 of the LED having a thin coating of gold thereon. In applicants' specific embodiment, the surface 29 was not fully coated with gold but a number of islands 30—30 of thin gold were placed thereon (see FIG. 1) to permit light generated within the LED 10 to pass through the surface 29. The bottom surface of the LED 10 is also coated with gold, or other noble metal.

In operation, an epoxy adhesive 31 is deposited in the bottoms of the cups 23—23 and the LED's 10—10 placed thereon. The epoxy adhesive 31 is also deposited on the first and second ends 26 and 27 of the interconnecting leads 24—24. The first ends 26—26 of the leads 24—24 are brought into contact with the LED's 10—10 and the second ends 27—27 of the leads 24—24 are brought into contact with the posts 21—21 as shown in FIG. 3. A force is then applied to the first and second ends 26 and 27, as indicated by arrows and the heat applied for a predetermined period of time to cure the epoxy adhesive 31. It should be noted that the invention is not limited to high temperature curing, epoxies that cure at room temperature have also been used to implement the instant bonding technique.

It should be noted that the epoxy adhesive 31 could be used at all the bonding sites, however, unfilled epoxy need not only be placed on the first end 26 of the terminal 24 for it is at this location that a filled epoxy can deleteriously affect the P-N junction 11 as hereinbefore described. Thus, it would only be necessary to apply a force at that location in order to obtain the desired connection. At locations where metal filled epoxies are used, it is not necessary to apply a force. The clamping force used in the exemplary embodiment at the site of the unfilled epoxy bond was 200 grams and the epoxy was subjected to a temperature between 175° C. and 185° C. for a period of about 18 minutes.

Once the epoxy adhesive 31 has been cured, the bonded articles are then subjected to a conventional encapsulation process followed by a conventional cutting operation, to remove unwanted portions of the lead frame 20. Each individual LED assembly 50 is partially encapsulated in a transparent or translucent envelope 51, e.g., an epoxy envelope having posts 21 and 22 extending therefrom as shown in FIG. 4.

It is to be understood that the specific sequence of steps in bonding a multi-element assembly 50 such as the above-described LED assembly 50 forms no part of the instant invention. Any sequence of operation may be used as long as an unfilled adhesive is used to electrically bond a portion of the microelectronic components together. Clearly, the bonding together of two elements (e.g., wire-wire, wire-terminal, etc.) using unfilled adhesive fall within the purview of the instant invention.

What is claimed is:

1. A method of providing an electrically conductive bond between substantially planar surfaces of first and second microelectronic components, comprising the steps of:
   coating at least a portion of the first and second components with a noble metal;
   applying an unfilled adhesive on the coated surface of at least one of the components;
   urging the components into intimate contact at the coated surfaces with the unfilled adhesive interposed therebetween; and
   applying a clamping force sufficient to provide an electrical connection between the components while curing the adhesive.

2. The method as set forth in claim 1, wherein:
   the noble metal is gold.

3. The method as set forth in claim 1, wherein:
   the first component is a light emitting diode; and
   the second component is an electrically conductive lead.

4. A method of fabricating a light emitting diode assembly (LED) having a light emitting diode bonded within a cup mounted on a first terminal, with an electrically conductive lead connecting the light emitting diode to a second terminal which is spaced from the first terminal, the method comprising:
   gold coating all surfaces to be bonded;
   depositing an unfilled epoxy in the cup;
   placing the LED in the epoxy;
   coating selected portions of the electrically conductive lead with unfilled epoxy;
   clamping the epoxy coated portions of the electrically conductive lead into intimate contact with the LED and the second terminal with a predetermined force sufficient to provide an electrical connection therebetween;
   subjecting the assembly to an elevated temperature for a predetermined period of time to cure the epoxy; and
   removing the clamping force at the end of said predetermined time.

* * * * *